Jan. 9, 1962 E. M. PELL 3,016,313

SEMICONDUCTOR DEVICES AND METHODS OF MAKING THE SAME

Filed May 15, 1958 2 Sheets-Sheet 1

Inventor:
Erik M. Pell,
by John F. Ahern
His Attorney.

SEMICONDUCTOR DEVICES AND METHODS OF MAKING THE SAME

Filed May 15, 1958 2 Sheets-Sheet 2

Inventor:
Erik M. Pell,
by John F. Ahern
His Attorney.

United States Patent Office 3,016,313

Patented Jan. 9, 1962

3,016,313

SEMICONDUCTOR DEVICES AND METHODS OF MAKING THE SAME

Erik M. Pell, Scotia, N.Y., assignor to General Electric Company, a corporation of New York Filed May 15, 1958, Ser. No. 735,411

6 Claims. (Cl. 148—1.5)

Figures 1, 2, 3, 4, 5, 6, 7, 8, 9, 10:
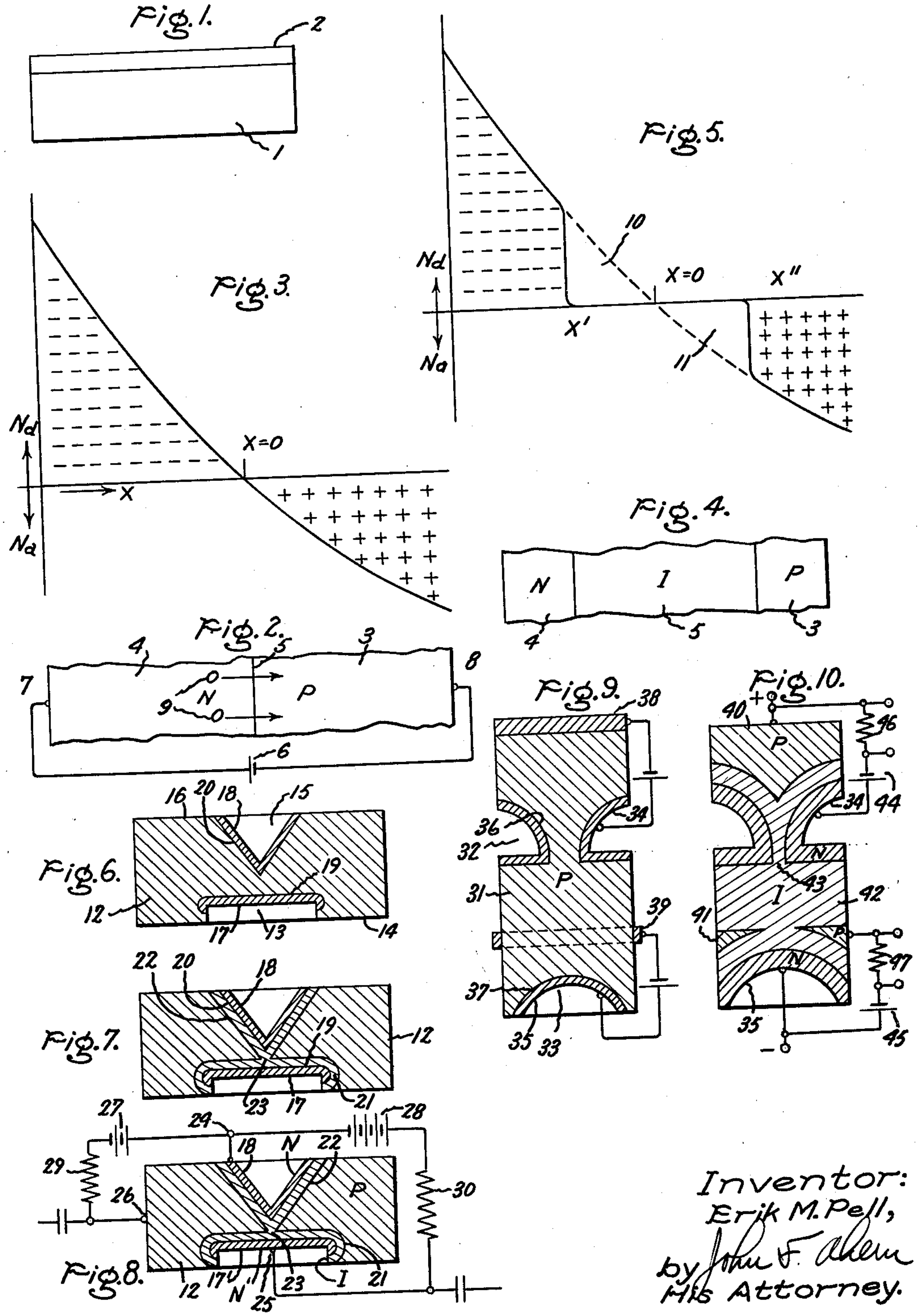

The present invention relates to improved semiconductor signal translating devices and to methods for the preparation thereof. More particularly, the invention relates to methods for producing intrinsic or nearly intrinsic conductivity type regions in semiconductor bodies and to the bodies in which these regions are produced.

Semiconductors useful for the fabrication of electric signal translating devices are of the covalent type, generally comprising a diamond crystal lattice structure. Electric conduction in such semiconductors is electronic and may be due to either an excess or deficiency of electrons. While the balance of electrons within semiconductor bodies which controls the type of conductivity which may be exhibited thereby may be affected by crystal imperfections, it is primarily controlled, in semiconductor device fabrication, by the addition, in controlled amounts, of chemical "activator impurities" which cause either an excess or deficiency of electrons within the semiconductor crystal lattice. Impurities which supply an excess of electrons to a semiconductor body are denominated as "donors," while those which cause a deficiency of electrons are denominated as "acceptors." Semiconductor bodies supplied with an excess of electrons exhibit N-type conductivity characteristics while semiconductor bodies exhibiting a deficiency of electrons exhibit P-type conductivity characteristics. Both P-type and N-type semiconductor bodies are said to exhibit extrinsic conduction characteristics. For germanium, silicon, and silicon carbide, the elements of group III of the periodic table, such as boron, aluminum, gallium, and indium, are acceptor activator impurities, while the elements of group V, such as phosphorus, arsenic, antimony, and bismuth, are donor activator impurities.

For the diatomic semiconductors composed of compounds of elements of groups III and V of the periodic table, such as aluminum phosphide, gallium arsenide, and indium antimonide, the elements of group II of the periodic table such as magnesium, zinc and cadmium are acceptors, while the elements of group V such as sulfur, selenium, and tellurium, are donors. For the semiconductors of the class comprising compounds between elements of groups II and VI of the periodic table such as cadmium telluride and zinc telluride, elements from groups I and V such as copper and antimony are acceptors, while the elements from groups III and VII, such as aluminum and chlorine, are donors. Beryllium is an acceptor in boron, while carbon and silicon are donors therein.

When a semiconductor body of monocrystalline structure includes two adjacent regions having opposite conductivity types, the junction between these regions, denominated a P-N junction, possesses marked rectifying characteristics and passes current predominantly in only one direction. When a pair of such junctions are closely juxtaposed and contacts are made to the three regions contiguous therewith, a signal translating device, denominated a transistor, useful in the generation and amplification of electrical signals, results.

Actually, the junction between two opposite-conductivity type regions of semiconductor is a finite region of a third type of semiconductor material, namely intrinsic semiconductor. Intrinsic type semiconductor material is semiconductor material which possesses an even balance of conduction carriers, that is, neither an excess nor a deficiency of electrons. Intrinsic conduction characteristics may be obtained by highly purifying the semiconductor so that no chemical impurities may add or remove free electrons in the lattice. Alternatively, intrinsic conduction characteristics may be obtained when donors and acceptors are present in equal numbers as at a P-N junction, so that complete compensation between donors and acceptors occur. Intrinsic semiconductor material is of extremely high resistivity. For example, germanium having a room temperature resistivity in excess of about 47 ohm centimeters is generally considered to be intrinsic, while silicon, having a room temperature resistivity of about 64,000 ohm centimeters is generally considered to be intrinsic. Silicon carbide having a room temperature resistivity in excess of $10^{22}$ ohm centimeters is intrinsic. For indium antimonide room temperature intrinsic resistivity is $5\times10^{-3}$ ohm centimeters.

In the formation of asymmetrically conductive devices, such as rectifiers and transistors, it is quite often highly desirable that wide intrinsic regions be present. This is due partly to the fact that, with wide intrinsic regions in transistors, lower collector capacitance and higher peak-inverse-voltage ratings result. Because of such low collector capacitance, N-P-I-N and P-N-I-P-type transistors having improved high frequency characteristics may be produced. Additionally, a whole class of devices, namely, analog transistors, require wide intrinsic regions. These devices are theoretically feasible and highly efficient, but have not heretofore been produced because of the difficulties attendant in forming wide intrinsic regions.

Accordingly, one object of the present invention is to provide a simple, easily performed method of forming wide P-N junction or intrinsic regions.

Another object of the present invention is to provide methods for the formation of semiconductor asymmetrically conductive devices having wide P-N junction or intrinsic regions.

Still another object of the present invention is to provide a method for forming analog transistors.

A further object of the present invention is to provide improved methods for the formation of P-N-I-P and N-P-I-N transistors.

A further object of the present invention is to provide improved semiconductor devices having high peak-inverse-voltage characteristics.

Briefly stated in accord with one feature of my invention, I form a wide P-N junction or intrinsic region in a semiconductor body having one type conductivity characteristics by first diffusing into the body an activator impurity for inducing opposite type conductivity characteristics which has a mobile ion. A narrow P-N junction is then formed. I then apply a strong electric field in the reverse direction across the P-N junction and heat the semiconductor body to a temperature sufficient to cause mobile ions of the activator impurity to migrate with the impressed electric field. Under these conditions, the ions drift across the P-N junction into a region of opposite-conductivity type. This results in the conductivity characteristics on either side of the originally narrow P-N junction becoming more nearly intrinsic. After a sufficient period of such drifting, a very wide intrinsic region is thus formed.

By this method, highly useful high peak-inverse-voltage rectifiers and transistors and low collector capacitance transistors may be formed. Additionally, this method is ideally suited for the formation of the very wide intrinsic regions necessary for analog transistors.

The novel features believed characteristic of the present invention are set forth in the appended claims. The invention itself, together with further objects and advantages thereof, may best be understood by reference to the following description taken in connection with the appended drawings in which:

FIG. 1 is a cross-sectional view of a body of semiconductor material coated with a rapidly-diffusing activator impurity in the practice of the present invention, FIG. 2 is a cross-sectional view of a portion of the body of FIG. 1 after a first diffusion step, FIG. 3 is a graphical representation of the excess activator concentration within the semiconductor body illustrated in FIG. 2, FIG. 4 is a cross-sectional view of a portion of the body of FIG. 1 after a second process step, FIG. 5 is a graphical representation of the excess activator concentration in the body illustrated in FIG. 4, FIG. 6 is a cross-sectional view of a body of semiconductor material having a rapidly-diffusing activator impurity diffused into certain surface-adjacent regions thereof in accord with another feature of the present invention, FIG. 7 is a cross-sectional view of an analog transistor formed from the body of FIG. 6 in accord with the invention, FIG. 8 is a schematic view of the device of FIG. 7 connected in circuit configurations as an amplifier, FIG. 9 illustrates another semiconductor body having surface-adjacent regions thereof diffused with a rapidly-diffusing activator impurity in accord with another feature of the present invention, FIG. 10 illustrates a solid-state thyratron device formed from the body of FIG. 9 in accord with the present invention, and FIGS. 11 to 15 inclusive illustrate, in graphical form, the diffusion characteristics and excess activator concentration gradients within a body of semiconductor material in the various steps of forming a N-P-I-N transistor in accord with another feature of the present invention.

Although, in the semiconductor arts, in a number of instances, it is highly desirable that wide intrinsic or near intrinsic regions be formed for high peak inverse voltage diodes, for P-N-I-P and N-P-I-N transistors, for analog transistors, and for many other uses, the actual fabrication of these regions has heretofore been extremely difficult. In one instance, namely, in the formation of analog transistors, the difficulties have been so great that no one has, heretofore, managed to form a successful analog transistor. The prior art approach to the problem of forming a wide intrinsic, or near intrinsic, region has been either to attempt to work with semiconductor material which is so highly purified that it may be classified as intrinsic, or to attempt to compensate donor and acceptor activator impurities so that the resistivity of the material is so high as to classify it as intrinsic. With both of these approaches, the greatest difficulty has been the necessity of maintaining either extremely high purity semiconductor or exactly compensated semiconductor while, at the same time, performing other process steps upon the semiconductor material necessary for fabrication of useful devices. Additionally, utilizing both of these techniques, however, to obtain a maximum of $10^{13}$ atoms of activator impurities per cubic centimeter of semiconductor, the maximum obtainable intrinsic region width is only about $10^{-3}$ centimeters at 100 applied volts.

I have found that wide intrinsic, or near intrinsic, regions may be formed in monocrystalline electronic semiconductor bodies by an entirely new and radical approach. In accord with my invention, I have found that when a P-N junction, formed by the diffusion of a rapidly diffusing activator impurity of one-conductivity inducing type into a region of opposite-conductivity type semiconductor is subjected to a relatively high electric field in the reverse direction and the semiconductor body is concurrently heated, the diffused activator ions immediately adjacent the junction migrate from one region thereof to the opposite region thereof causing a relatively wide intrinsic or near intrinsic region to be formed. As used herein, the term "rapidly diffusing activator impurity" is meant to connote an activator impurity for a semiconductor which exhibits a diffusion coefficient in the particular semiconductor of approximately $10^{12}$ centimeters$^2$ per second at a temperature at which the rectifying characteristics of a P-N junction may be maintained in the semiconductor when the P-N junction is subjected to an electric field in the reverse direction of approximately $10^5$ volts per centimeter. Although it is possible that junctions may be formed in accord with the present invention utilizing impurity activators which diffuse at slower rates, the time for such formation would be prohibitive.

In accord with the basic concept of my invention, the activator ions are heated to facilitate their mobility and are subjected to an extremely high electric field in the vicinity of the junction to cause them to migrate. Once they have migrated and caused the establishment of an extremely wide intrinsic or near intrinsic region, the body is cooled and the applied electric field is removed. The process is not reversible in the sense that, in the normal operation of a semiconductor device constructed in accord with the present invention, a high electric field cannot be reproduced in the forward direction to cause ions to drift back across the junction. Additionally, once the rapidly diffusing ions are caused to diffuse into an opposite-conductivity region to form a wide P-N junction or intrinsic region, it is highly probable that the ions are then maintained in place by the colombic attraction with opposite-conductivity inducing-type impurity atoms by the phenomenon of ion-pairing.

While the present invention may be practiced with any electronic semiconductor material as, for example, those set forth by way of example hereinbefore, and with any rapidly diffusing activator impurity as defined hereinbefore, the invention, for sake of clarity and ease of description, will be specifically described with reference to the formation of wide intrinsic regions in silicon using lithium as the rapidly diffusing activator impurity. Accordingly, in the detailed description of the invention, with reference to FIGS. 1 through 15, the semiconductor bodies are assumed to be silicon and the rapidly diffusing activator impurity is assumed to be lithium, a donor in silicon.

In FIG. 1 of the drawing there is illustrated a semiconductor body 1 which may conveniently be, as an illustration, a 0.25" x 0.25" x 0.050" monocrystalline body of silicon impregnated with approximately $10^{16}$ atoms per cubic centimeter of boron to provide the body with P-type conductivity characteristics. In order to prepare body 1 for the first step in the creation of a broad intrinsic region therein in accord with the present invention, a thin layer 2, approximately several microns thick, of lithium may conveniently be deposited thereon by surface-alloying or by any other suitable technique. Body 1 is then, in accord with the invention, subjected to elevated temperature for a sufficient period of time to cause the lithium in layer 2 to diffuse into body 1 a sufficient depth to cause a portion only thereof to be converted to N-type conductivity silicon. This may, for example, be accomplished by heating body 1 to a temperature of 300° to 700° C. for 1 to 60 minutes, but will vary with the size of wafer 1 and the desired position of the P-N junction. For materials other than silicon and lithium, the criteria generally followed for the thermal formation of P-N junctions well known in the art, may be followed. This includes techniques generally referred to as alloying as well as diffusion and includes any suitable thermal technique for heating an impurity activator in gaseous, liquid, or solid phase in contact with a semiconductor to cause a P-N junction to be formed therein.

In FIG. 2 of the drawing there is illustrated, in vertical cross section, a portion of the body of FIG. 1 after the body has, for example, been heated to a temperature of approximately 500° C. for 2 minutes to cause lithium to diffuse a depth of 0.005 inch to form a P-N junction with the main body of boron-impregnated silicon at that depth. In FIG. 2, P-type region 3 is separated from N-type lithium-diffused region 4 by a narrow P-N junction 5.

FIG. 3 of the drawing is an excess activator concentration diagram corresponding to the cross section of the silicon body diffused with lithium illustrated in FIG. 2 of the drawing. In FIG. 3, the axis of abscissae represented by the arrow X, is representative of the distance traveled into the silicon body of FIG. 1 from surface 7 in FIG. 2. The axis of ordinates as represented by the upwardly extending arrow labeled $N_d$ and the downwardly extending arrow labeled $N_a$ is representative of the concentration within the body of excess (uncompensated) donors and acceptors respectively. Thus, if the body is N-type at a given point, the curve at that point will be above the axis of abscissae, representative of an excess of donor activator impurities. If, on the other hand, the body at any given point exhibits P-type conductivity characteristics, the curve at that point is located below the axis of abscissae and is representative of an excess of acceptor activator impurities. As may be seen from the curve of FIG. 3, N-type region 4 of the body of FIG. 2 is represented on the curve by an excess of donor activator impurities which gradually decreases to zero at X=0, the position represented by P-N junction 5 in FIG. 2. At distances into the crystal farther than X=0, the device of FIG.2 is indicated as possessing P-type conductivity characteristics, corresponding to P-type region 3.

Once the narrow P-N junction indicated at 5 and illustrated graphically in FIG. 3 of the drawing has been formed, a source of potential, unidirectional in nature, represented generally by battery 6 in FIG. 2, is connected between opposite surfaces 7 and 8 of the crystal so that P-N junction 5 is subjected to a strong bias in the reverse direction. A P-N junction may be said to be biased in the reverse direction when the polarity of the voltage applied to a given region on a particular side of the junction is opposite to the sign of the majority conduction carriers in that region of the body. Thus, to bias P-N junction 5 in the reverse direction, the positive pole of battery 6 is connected to N-type region 4 at surface 7, and the negative pole of battery 6 is connected to P-type region 3 at surface 8. The magnitude of the voltage applied by voltage source 6 is adjusted so that the magnitude of the electric field at the junction is approximately $10^5$ volts per centimeter, in this instance, a value of about 100 volts. In accord with the invention, while the reverse bias is maintained upon P-N junctions, the silicon body is heated to a temperature sufficient to cause the diffused impurity ions to have sufficient mobility to drift, under the impetus of the applied electric field, and to cross the junction to neutralize corresponding opposite-conductivity inducing activator impurities on the opposite side thereof. The temperature to which the body is raised should not, however, be sufficiently large as to cause the rectifying characteristic of the P-N junction to be destroyed or obliterated by thermal activity of the atoms of the host semiconductor lattice.

As is mentioned hereinbefore, the mobile ion has sufficient mobility to migrate across the P-N junction when the diffusion constant is of the order of $10^{12}$ centimeters$^2$ per second, under the applied electric field of approximately $10^5$ volts per centimeter. The voltage necessary to sustain such a field generally rises as the mobile ion diffuses, but may be controlled accurately so as to keep a constant current flow through the junction. Thus, for example, while diffusing lithium in silicon, a current of 10 ma./cm.$^2$ is maintained. When the mobile diffusing ion is lithium and the host lattice is silicon, the diffusion temperature may conveniently be approximately 100° to 175° C. As is illustrated in FIG. 2 of the drawing, lithium ions 9 diffuse across P-N junction 5. The diffusion of mobile lithium ions 9 has a two-fold effect. By removing the negative mobile charge associated with positive ions 9 from region 4 in the vicinity of junction 5, region 4 adjacent the junction becomes less strongly N-type and more nearly intrinsic. Additionally, as these ions cross the junction and enter into P-type region 3 in the vicinity of the junction, this region becomes less strongly P-type and more nearly intrinsic. When a sufficient number of lithium ions have crossed P-N junction 5, the region immediately adjacent this junction in regions 3 and 4 is intrinsic or substantially intrinsic, and the body has a very wide P-N junction or intrinsic region therein.

In FIG. 4 of the drawing there is illustrated a vertical cross-sectional, partially broken away view of a portion of the silicon body of FIG. 2 after the high temperature lithium diffusion has been effected. As may be seen from FIG. 4, the intrinsic region 5, formerly representable by a line and referred to as a P-N junction, is now quite broad and separates N-type region 4 from P-type region 3 by a substantial distance.

In FIG. 5 of the drawing there is presented a graphical representation of the donor and acceptor activator excess impurity concentration within silicon body 1 corresponding to the formation of intrinsic region 5 in FIG. 4 of the drawing. As may be seen from FIG. 5, the intrinsic portion of the body is no longer limited to the region of X=0 but extends from X′ to X″, a region which is either intrinsic or nearly intrinsic due to the migration of lithium ions from region 10 below the curve to the left of X=0 to region 11 above the curve to the right of X=0. The thickness of region X′—X″ depends entirely upon time. The longer the mobile-ion drift is carried on, the wider this region is. It is not possible, however, that this region may deviate from intrinsic conductivity by making a swing from one conductivity type to the other due to an excess migration of mobile lithium ions across the barrier. This is because the high field gradient across the barrier necessary to cause the diffusion of mobile lithium ions from the N-type side of the barrier to the P-type side of the barrier disappears if an excess number of lithium ions cross the barrier. Additionally, the motivating force tending to drive lithium ions across the barrier decreases as the intrinsic region widens for a given voltage.

One high peak-inverse-voltage diode made in accord with the invention was fabricated as follows. A monocrystalline P-type silicon wafer impregnated with boron and having a room temperature resistivity of 20 ohm centimeters and having a diameter of 0.75 inch and a thickness dimension of 0.065 inch was contacted upon one surface with a 0.130 inch diameter droplet having a thickness of approximately 0.015 inch and composed of approximately 30% by weight of lithium in mineral oil. The wafer was then heated at a temperature of 500° C. for 1½ minutes to form a narrow P-N junction under the lithium dot. The dot was then biased in the reverse direction with a unidirectional voltage of 75 volts and heated at 170° C. for 100 minutes. As heating progressed, the current through the junction tended to fall off, but the voltage was raised, ultimately reaching a value of 2400 v., in order to maintain a constant junction current of 1 milliampere, indicative of a constant field of approximately $10^5$ volts per centimeter. As indicated after this treatment, the diode sustained over 3000 volts in the reverse direction with a leakage current of approximately 1 milliampere.

In FIGS. 6, 7, and 8 of the drawing, there are illustrated successive steps for the formation of a triode analog transistor in accord with another feature of the present invention. In FIG. 6 a body 12 of P-type silicon impregnated with approximately $10^{16}$ atoms per cubic centimeter thereof of boron, having a resistivity of approximately 1 ohm centimeter, has a disk-shaped depression 13 cut in one major surface 14 thereof and a conical depression 15 cut in a second major surface 16 thereof. The interior surfaces of the body of each of the depressions 13 and 15 are then coated with a thin layer of lithium, which may be conveniently deposited by surface alloying. The silicon body is then heated in a non-reactive atmosphere, for example, for approximately 1½ minutes at a temperature of approximately 500° C. to cause the formation of N-type lithium diffused regions 17 and 18 immediately adjacent depressions 13 and 15 respectively in body 12. N-type region 17 is separated from the main body of silicon crystal 12 by a first P–N junction 19 while N-type region 18 is separated from the main body of P-type silicon wafer 12 by a second P–N junction 20.

To form an analog transistor from silicon body 12 as illustrated in FIG. 6 after a first diffusion step,, each of the P–N junctions 19 and 20 are biased in the reverse direction as was P–N junction 5 in FIG. 2 of the drawing, and a sufficient voltage is applied thereto to cause a field of approximately $10^5$ volts per centimeter to exist thereacross. In this embodiment, a constant voltage of 75 volts is sufficient. While the P–N junctions are thus biased in the reverse direction, the entire body is inserted into an oven and heated to a temperature of approximately 170° C. for ½ hour. During this period, the lithium ions immediately on the N-type side of each of P–N junctions 19 and 20 migrate across the junction leaving a less N-type region on that side of the junction and causing a less P-type region on the opposite side of the junction. After sufficient diffusion of mobile lithium ions has occurred, the result is that a wide intrinsic or near intrinsic region 21 is formed adjacent P–N junction 19 and a wide intrinsic or near intrinsic region 22 is formed adjacent to P–N junction 20 in FIG. 7 of the drawing. Intrinsic or near intrinsic regions 21 and 22 join at region 23. Region 23 constitutes a circular or near circular aperture in P-type region 12. Since the aperture at 23 is substantially circularly symmetrical about an axial line from the apex of indentation 15 to the center of indentation 13, it is ideally suited as a gate electrode. The semiconductor body thus is comprised of a main P-type body 12 having two N-type regions 17 and 18 separated from one another by a relatively broad intrinsic region which is comprised of regions 21 and 22 which have a narrow aperture 23 at the junction of these two regions. While the formation of the device of FIG. 7 is set forth specifically with respect to time, temperature, etc., it will be appreciated that the same variations therein discussed with respect to the device of FIGS. 1 and 3 may be made.

In FIG. 8 of the drawing, the device formed in accord with the present invention and illustrated after the mobile-ion drift step in FIG. 7 is shown with electrodes connected thereto and suitable electronic circuitry to form an electric current amplifier. In FIG. 8, a cathode or source connection 24 is made to N-type region 18, analogous to a cathode, an anode or drain connection 25 is made to N-type region 17, analogous to an anode and a grid or gate connection 26 is made to the main P-type region of crystal 12. Grid or gate connection 26 is biased negatively by means of a unidirectional voltage source, represented generally as battery 27, and a positive potential is supplied to anode connection 25 by means of a unidirectional source represented generally as a battery 28. Both potentials are defined with respect to cathode connection 24. In operation, electrons are emitted from N-type region 18 and pass through intrinsic regions 22 and 21 and are collected by N-type region 25. When electric signals are impressed upon grid connection 26, the electric field at orifice 23 modulates the flow of electrons between cathode 24 and anode 25, as in a conventional vacuum tube. Input signals are supplied across input resistor 29 and an output signal is taken across output resistor 30. The operation of the analog transistor is not described in detail herein since this operation is well known, and is described in the art.

One device as illustrated in FIGS. 7 and 8 was made from a 10 mm. diameter 2.5 mm. thick disc of boron impregnated 1 ohm centimeter silicon having monocrystalline structure. Depression 13 was 5 mm. in diameter and .5 mm. deep. Depression 15 had an apex angle of 90° and penetrated to a depth of 1.6 mm., leaving the interior region of the crystal 0.4 mm. thick.

Lithium was alloyed into regions 17 and 18 at 500° C. for 1½ minutes from a 30% lithium-mineral oil suspension. Mobile ion drift was conducted at a temperature of 170° C. and a constant voltage of 75 volts. When connected as in FIG. 8 with a grid bias of —3 volts and an anode potential of 100 v., a power gain of 17 db and a voltage gain of 4 were realized. General devices of this type are "ion drifted" until it is possible, by an external circuit as illustrated in FIG. 8, to pass electrons from cathode to anode. This indicates that the two intrinsic regions adjacent the two junctions have passed through the separating P-type region and joined.

In FIGS. 9 and 10 of the drawing, there are illustrated a preliminary and a final state of fabrication of a solid state thyratron device in accord with another feature of the present invention. In FIG. 9, a cylindrically shaped monocrystalline body 31 of silicon impregnated with approximately $10^{16}$ atoms per cubic centimeter thereof of boron to impart thereto P-type conduction characteristics and a conductivity of approximately 1 ohm centimeter has inscribed as by etching or sand blasting around the periphery thereof, an annular groove 32 having a flat lower surface and a concave upper surface. Upon each of these surfaces, there is deposited as, for example, by surface alloying from a lithium-mineral oil suspension as described hereinbefore, a thin layer several microns thick of lithium. A hemispherical indentation 33 is similarly made at one end of body 31 closest to the flat surface of annular groove 32. A layer of lithium is deposited, conveniently by surface-alloying, over the hemispherical surface of indentation 33. Body 31 is then placed in a suitable oven and is heated in a suitable non-reactive atmosphere for approximately 2 minutes at a temperature of approximately 500° C. to cause the deposited lithium to diffuse a controllable depth into the P-type silicon wafer to cause formation of a first N-type region 34 adjacent to groove 32 and a second N-type region 35 adjacent to hemispherical indentation 33. A first P–N junction 36 separates N-type region 34 from the main P-type body of crystal 31 and a second P–N junction 37 separates N-type region 35 from the main P-type region of crystal 31.

P–N junctions 36 and 37 are then biased in the reverse direction in the same fashion as P–N junction 5 is biased as illustrated in FIG. 2 of the drawing, and the entire crystal is placed in a suitable oven and heated as, for example, to a temperature of approximately 170° C. for approximately 30 minutes to allow mobile lithium ions to drift across the P–N junctions and form a wide intrinsic region surrounding N-type regions 34 and 35. In utilizing the geometry illustrated in FIG. 9 to form the device of FIG. 10, connections are made to the P-type region by means of electrode 38 which contacts the entire upper surface of cylindrical body 31, and electrode 39 which is a band surrounding the entire lower periphery of body 31. As a result of lithium drifting across established P–N junctions 36 and 37 to form wide intrinsic regions, the configuration illustrated in FIG. 10 of the drawing results.

In FIG. 10, P-type regions 40 and 41 are separated from N-type regions 34 and 35 by a wide intrinsic region 42 which possesses an aperture 43 caused by the "necking-down" of N-type region 34 to form a first control electrode analog. P-type region 41 itself forms a second control electrode analog which, like first control electrode analog 34, is interposed in the path of current flow between cathode analog 35 and anode analog 40. In operation, the device of FIG. 10 operates as an analog thyratron device as follows. Control analog electrodes 34 and 41 are each biased with a reverse voltage by batteries 44 and 45 respectively through resistances 46 and 47 respectively. These bias voltages create electric fields within the control electrode apertures which prevent the establishment of a forward electric field between cathode 35 and anode 40 when a forward voltage is applied as indicated. The bias voltages then, as in a thyratron, prevent current flow through the device. When, however, an oppositely poled pulse or signal is applied to either control electrode, majority carriers are injected into the intrinsic region from the associated main electrode, either anode (drain) or cathode (source). These majority carriers are attracted by the remaining control electrode, and in circulating through the external circuit, reduce the reverse bias causing majority carriers (of opposite sign from the original majority carriers) to be injected into the intrinsic region from the main electrode associated therewith. These carriers are then attracted by the first control electrode and the process becomes regenerative and builds up until a significant proportion of majority carriers are exchanged between cathode and anode. The control electrodes then loose control and the device becomes a low forward impedance device. The input signal voltage at which control is lost may, as in a vacuum tube, be preselected by proper design.

The formation of devices such as those illustrated in FIGS. 8 and 10 is typical of an almost infinite number of variations which may be practiced to form solid-state analogs to a large number of vacuum tubes. In the formation of these devices, as practiced in accord with the present invention, a common denominator may be found in the following. In all cases, at least two regions of opposite-conductivity type semiconductors are formed by the impregnation of these regions with a highly mobile opposite-conductivity type inducing activator, the main body being of one-conductivity type. These ions are then caused to drift across P-N junctions under the influence of elevated temperatures and an applied high electric field, generally of the order of $10^5$ volts per cm. until the wide intrinsic regions formed around the respective P-N junctions join at, at least, one spot by causing an intrinsic region to penetrate through a thin one-conductivity type region from both sides. Ion drift is generally stopped as soon as this occurs. This is because the intrinsic region then forms a path for conduction carriers, and the one-conductivity type region through which a hole has been formed may then be utilized as a grid or gate electrode to control the flow of conduction carriers through the opening in the one-conductivity type semiconductor region. This feature was utilized in forming aperture 23 in FIG. 10 and in forming the aperture in P-type region 41 in the device of FIG. 10.

The foregoing method produces a triode device. On the other hand, a tetrode, a higher order device, may be made by forming holes in more than one thin one-conductivity type region.

Another method of forming a triode analog device is to form grid or gate electrode by the technique utilized to form control electrode 34 in the device of FIG. 10. This constitutes originally forming the opposite-conductivity type zone impregnated with highly mobile ions with a fairly narrow orifice therein, so that when ion drifting occurs, the semiconductor contained in this orifice becomes intrinsic and is in the path between the source and drain electrodes. Thus, the opposite-conductivity type region becomes the grid or gate electrode as is electrode 34 in FIG. 10. This process may also be used to form two or more opposite-conductivity grid or gate electrodes to form a tetrode or higher order analog device.

In FIGS. 11 to 15 of the drawing, there are illustrated in vertical cross-sectional view, a portion of a silicon semiconductor crystal which is progressively formed into an N–P–I–N structure suitable for use as a very high frequency transistor device. Accompanying the vertical cross-sectional views, are concentration diagrams, 11*a* to 15*a* which illustrate the concentration of excess donors and acceptors in the accompanying cross-sectional views as the process progresses start to finish.

Figure 11:
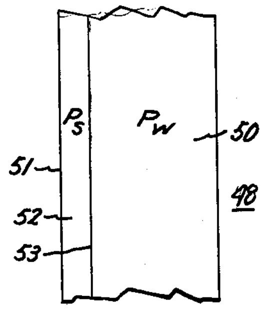

In FIG. 11, there is illustrated a P-type silicon semiconductor body 50 impregnated with approximately $10^{16}$ atoms per cubic centimeter thereof of a slow-diffusing acceptor impurity such as indium to impart thereto a low level of P-type conductivity in region 50 characterized by $p_w$ or weakly P-type. Into this body there is diffused from surface 51 thereof, a gradually decreasing concentration of boron atoms amounting to a maximum of approximately $10^{22}$ atoms per cubic centimeter thereof at surface 51. Boron is, for example, diffused into region 52, adjacent surface 51 to form a strongly P-type region denominated $p_s$ by heating the silicon body for approximately two hours in a saturated atmosphere of $B_2O_3$ at a temperature of approximately 1200° C. to cause the diffusion of boron thereinto. The interface between regions 52 and 50 constitutes a $p_s$—$p_w$ junction 53.

In FIG. 11*a*, which accompanies and describes the concentration of activator impurities in FIG. 11, there is represented the concentration of boron in region 52 and the concentration of indium in region 50 in FIG. 11. As may be seen from the drawing, $p_s$—$p_w$ junction 53 is located at point $X_0$ in FIG. 11*a*.

Figure 12:
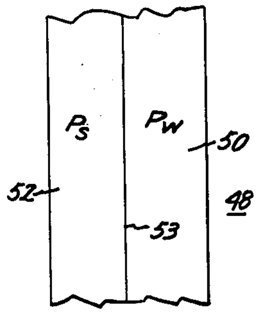

In FIG. 12 of the drawing, there is illustrated the same silicon monocrystalline body as is illustrated in FIG. 11 after the next process has been performed thereupon. This process step consists of first taking the body of FIG. 11 and submerging it in a suitable etch as, for example, $Cp_4$ etch or white etch to remove all boron from surface 51 and washing. The body is then placed in a suitable inert atmosphere and heated to a temperature of approximately 1200° C. for a period of approximately 10 hours to cause surface adjacent region 52 having strong P-type conductivity characteristics to be broadened out by a further diffusion of the high concentration of boron illustrated in FIG. 11*a* so that the entire widened region 52 in FIG. 12 contains a lower, but nevertheless, still, high, concentration (approximately $10^{18}$ atoms per cubic centimeter of boron atoms). As the strongly P-type region 52 expands, the $p_s$—$p_w$ junction 53 also moves inwardly of the crystal away from surface 51. The concentration, as described above, is illustrated graphically in FIG. 12*a* of the drawing wherein it may be seen that the original strongly P-type region has become wider, but less strongly P-type. The $p_s$—$p_w$ junction is now located at $X_0'$.

Figure 13:
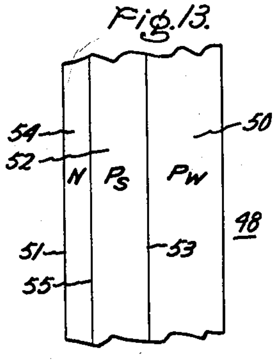
Figure 13:
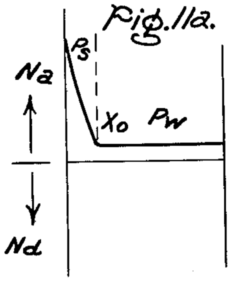
Figure 13:
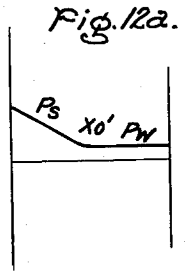
Figure 13:
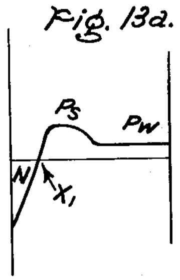

In FIG. 13 of the drawing, there is illustrated a vertical cross-sectional view of the silicon crystal illustrated in FIGS. 11 and 12 after a third process step has been performed thereupon. This third process step comprises diffusing a concentration of phosphorus through surface 51. This may be accomplished by heating the silicon crystal for a period of approximately 5 hours at approximately 1200° C. in an argon atmosphere which has been saturated with $P_2O_5$ vapor at a temperature of approximately 500° C., to cause the phosphorus to diffuse into the crystal forming a surface adjacent region 54 having N-type conductivity characteristics. After the diffusion step, the crystal is ground on all sides except surface 51 to remove any phosphorus diffused regions which may have been caused by the phosphorus atmosphere.

As may be seen in FIG. 13*a* of the drawing, there is an excess of donor activator impurities within region 54, and at $X_1$, a P-N junction 55 is formed which constitutes the interface between N-type region 54 and P-type region 52. During the phosphorus diffusion step, there occurs a further leveling out of the concentration of acceptor activator atoms within region 52 so that $p_s$—$p_w$ junction 53 moves farther away from surface 51 and the concentration of boron activator impurities within region 52 drops to a still lower level.

Figure 14:
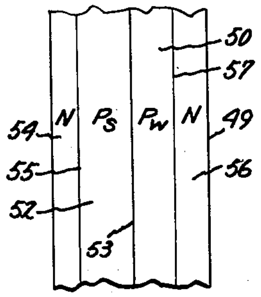

FIG. 14 is a vertical cross-sectional view of a portion of the same silicon crystal after a next process step has been performed thereupon. FIG. 14*a* is a concentration diagram illustrating the concentration of excess donor and acceptor activators within the same crystal after the same process step. This process step constitutes the diffusion of highly mobile lithium ions through surface 49 to cause a surface-adjacent region 56 to have an excess of donor activator impurities and to exhibit N-type conduction characteristics. The diffusion of this lithium concentration may be performed substantially as follows. A thin layer of lithium is deposited upon surface 49 by painting surface 49 with a layer of approximately 0.015 inch thick of a 30% solution of lithium in mineral oil. The silicon crystal is then elevated to a temperature of 500° for approximately 3 minutes in an inert (argon) atmosphere, during which time the mineral oil evaporates and the lithium diffuses into the crystal. The interface between region 56 and P-type region 50 is a second P-N junction 57. In FIG. 14*a* region 56 is shown as possessing an excess of donor activator impurities, region 50 is shown as retaining a low concentration of excess acceptor activator impurities, and region 52 is shown as possessing a strong concentration of excess acceptor activator impurities. The diffusion of highly mobile lithium ions into region 56 does not substantially affect the position of $p_s$—$p_w$ junction 53 nor the position of regions 52, 54, and P-N junction 55 within the crystal.

Figure 15:
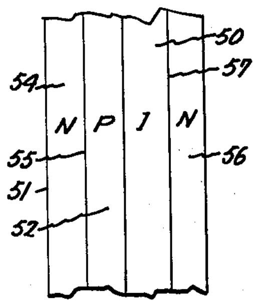
Figure 15:
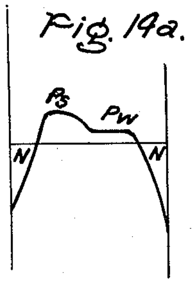
Figure 15:
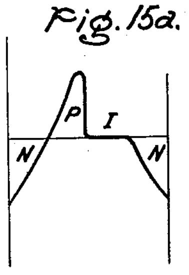

FIG. 15 is a vertical cross-sectional view of the same silicon crystal after the next process step has been performed thereupon. FIG. 15*a* is a corresponding activator impurity excess concentration diagram corresponding to FIG. 15, after the next process step has been performed thereupon. This process step comprises heating the crystal to a moderately high temperature while a reverse bias is maintained across P-N junction 57 to cause the highly mobile lithium ions adjacent junction 57 to diffuse from region 56 into weakly P-type region 50 to cause region 50 to be transformed into a region possessing intrinsic conductivity characteristics, thus providing wide intrinsic region between P-type region 52 and N-type region 56. As may be seen in FIG. 15, the foregoing has been accomplished. As may be seen from FIG. 15*a*, region 56 possesses an excess of donor (lithium) activator impurities caused by the original lithium diffusion. Region 50 possesses neither an excess of donor nor acceptor activator impurities and is, hence, intrinsic. Region 52 possesses a relatively high concentration of excess acceptor (boron) activator impurities. Region 54 possesses a relatively heavy concentration of donor (phosphorus) activator impurities. The interface between regions 52 and 54 constitutes a P-N junction 55 which may be utilized as an emitter junction for a high frequency transistor. Intrinsic region 50 constitutes a collector junction for the same high frequency device. To form an N-P-I-N transistor from the silicon wafer, an emitter contact is made to region 54, a base contact is made to region 52, and a collector contact is made to region 56.

While the invention has been set forth hereinbefore primarily for illustrative purposes with reference to the specific operation of the process utilizing lithium as a rapidly diffusing activator impurity in silicon as the host semiconductor, it is readily apparent that the invention has much wider applicability and may be performed in any electronic conduction covalent semiconductor as, for example, germanium, silicon carbide, boron, and the intermetallic compounds set forth hereinbefore. Additionally, other rapidly diffusing activators which may exhibit a diffusion constant of $10^{12}$ centimeters$^2$ per second at an applied field of approximately $10^5$ volts per centimeter in any given semiconductor at a temperature which is insufficient to cause a P-N junction within that semiconductor to be destroyed by thermal activity may be utilized to practice the invention in that semiconductor host. Specifically, the aforementioned conventional donor and acceptor activators for high temperature semiconductors having a band gap in excess of 1.4 ev., such as, silicon carbide, indium antimonide, gallium arsenide, aluminum antimonide and boron have high diffusion constants. This fact, coupled with the fact that P-N junctions may be maintained at high temperatures in semiconductors having a band gap greater than 1.4 ev., makes these high temperature semiconductors, together with their usual activator impurities, ideally suited for the practice of the present invention. The use of lithium in silicon carbide, boron, and group III–V intermetallic compounds is also ideally suited.

While the invention has been set forth hereinbefore with respect to certain specific examples as preferred embodiments, many modifications and changes will readily occur to those skilled in the art. Accordingly, by the appended claims, I intend to cover all such modifications and changes as fall within the true spirit and scope of the invention.

What I claim as new and desire to secure by Letters Patent of the United States is:

1. The process of forming a wide intrinsic region in a semiconductor body of one-conductivity type which comprises; heating a rapidly diffusing opposite-conductivity type inducing activator impurity in contact with a one-conductivity type body of the semiconductor to cause the activator to penetrate therein and form a P-N junction therein; applying an electric field in the reverse direction across the P-N junction so formed; and concurrently heating the semiconductor body to cause thermally excited ions of the rapidly diffusing activator to migrate across the P-N junction under the influence of the applied electric field to form a wide intrinsic region.

2. The process of forming a wide intrinsic region in a semiconductor body of one-conductivity type which comprises; heating a rapidly diffusing opposite-conductivity type inducing activator impurity in contact with a one-conductivity type body of semiconductor to cause the activator to penetrate therein and form a P-N junction; applying an electric field in the reverse direction across the P-N junction so formed; and concurrently heating the semiconductor body to a temperature insufficient to destroy the rectifying characteristics of the P-N junction therein but sufficient to cause thermally excited ions of the rapidly diffusing activator to migrate across the P-N junction under the influence of the applied electric field to form a wide intrinsic region.

3. The process of forming a wide intrinsic region in a semiconductor body of one-conductivity type which comprises; heating a rapidly diffusing opposite-conductivity type inducing activator impurity in contact with a one-conductivity type body of a semiconductor to cause the activator to penetrate into only a portion thereof to form a P-N junction therein; applying an electric field in the reverse direction across the P-N junction so formed insufficient in magnitude to cause the P-N junction to break down; and concurrently heating the semiconductor body to a temperature insufficient to cause the P-N junction within the body to be destroyed but high enough to cause thermally excited ions of the rapidly diffusing activator to migrate across the P-N junction under the influence of applied electric field to form a wide intrinsic region.

4. The process of forming a wide intrinsic region in a semiconductor body of one-conductivity type which comprises; heating a rapidly diffusing opposite-conductivity type inducing activator impurity in contact with a one-conductivity type body of a semiconductor to cause the activator to penetrate into only a portion thereof to form a P-N junction therein; applying an electric field of approximately the order of $10^5$ volts per centimeter in the reverse direction across the P-N junction so formed; and concurrently heating the semiconductor body to a temperature insufficient to cause the P-N junction therein to be destroyed but sufficient to cause thermally excited ions of rapidly diffusing activator to migrate across the P-N junction under the influence of the applied electric field to form a wide intrinsic region.

5. In the formation of a solid-state vacuum tube analog device, the process of forming a control electrode which comprises; forming in an elongated body of one-conductivity type semiconductor a peripheral region of opposite-conductivity type semiconductor having therein an excess concentration of highly mobile opposite-conductivity type inducing activator for the semiconductor, said peripheral region being separated from the main body of one-conductivity type semiconductor by a P-N junction; applying an electric field in the reverse direction across said P-N junctions and concurrently heating said body to cause highly mobile activator ions to migrate across said P-N junctions to form a wide intrinsic region which completely encompasses the region of the body interior of the peripheral opposite-conductivity type region.

6. In the formation of a solid-state vacuum tube analog device, the process of forming a control electrode which comprises; forming in a body of one-conductivity type semiconductor a spaced pair of opposite-conductivity type regions by impregnating spaced surface-adjacent regions thereof with a highly mobile opposite-conductivity type inducing activator impurity for the semiconductor, said regions being spaced apart from one another by a thin region of one-conductivity type semiconductor, and from said region of one-conductivity type semiconductor by respective P-N junctions; applying an electric field in the reverse direction across said P-N junctions and concurrently heating said body to cause highly mobile activator ions to migrate across said P-N junctions to form a plurality of spaced intrinsic regions which penetrate through said thin one-conductivity type zone and merge to form a single continuous intrinsic region within said body.

References Cited in the file of this patent

UNITED STATES PATENTS

| | | |
|---|---|---|
| 2,819,990 | Fuller et al. | Jan. 14, 1958 |
| 2,825,858 | Kuhrt | Mar. 4, 1958 |
| 2,850,687 | Hammes | Sept. 2, 1958 |
| 2,859,142 | Pfann | Nov. 4, 1958 |
| 2,908,871 | McKay | Oct. 13, 1959 |